United States Patent
Wieduwilt et al.

(10) Patent No.: US 11,948,660 B2
(45) Date of Patent: Apr. 2, 2024

(54) FUSE DELAY OF A COMMAND IN A MEMORY PACKAGE

(71) Applicant: Micron Technology, Inc., Boise, ID (US)

(72) Inventors: Christopher G. Wieduwilt, Boise, ID (US); Lawrence D. Smith, Boise, ID (US); James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 17/381,057

(22) Filed: Jul. 20, 2021

(65) Prior Publication Data

US 2023/0026202 A1    Jan. 26, 2023

(51) Int. Cl.
G11C 7/22    (2006.01)
G11C 7/10    (2006.01)
G11C 17/16   (2006.01)

(52) U.S. Cl.
CPC .............. *G11C 7/222* (2013.01); *G11C 7/106* (2013.01); *G11C 7/1063* (2013.01); *G11C 7/1087* (2013.01); *G11C 7/109* (2013.01); *G11C 17/16* (2013.01)

(58) Field of Classification Search
CPC ................................. G11C 7/222; G11C 7/22
USPC ..................................................... 365/233.1
See application file for complete search history.

(56) References Cited

U.S. PATENT DOCUMENTS

| | | | |
|---|---|---|---|
| 6,717,877 B2 * | 4/2004 | Suzuki ................... | G11C 7/22 365/207 |
| 7,277,350 B2 | 10/2007 | Huckaby et al. | |
| 9,030,245 B2 * | 5/2015 | Sakashita ............... | G06F 1/10 327/284 |
| 9,036,434 B1 * | 5/2015 | Wu ........................ | G11C 7/22 365/194 |
| 9,721,675 B1 * | 8/2017 | Choi ..................... | G11C 29/023 |
| 9,881,664 B1 | 1/2018 | Ying et al. | |
| 10,996,885 B2 | 5/2021 | Lee et al. | |
| 2002/0167855 A1 | 11/2002 | Hsu et al. | |
| 2010/0135090 A1 * | 6/2010 | Gomm .................. | H03L 7/0814 365/194 |
| 2020/0176047 A1 | 6/2020 | Meier et al. | |
| 2020/0219555 A1 | 7/2020 | Rehmeyer | |
| 2020/0388324 A1 | 12/2020 | Rehmeyer et al. | |
| 2021/0005244 A1 | 1/2021 | Hiscock et al. | |

OTHER PUBLICATIONS

High Bandwidth Memory with ECC, Micron Data Sheet,2018,pp. 1-11, retrieved from https://media-www.micron.m/-/media/client/global/documents/products/data-sheet/dram/hbm2e/8gb_and_16gb_hbm2e_dram.pdf?ev=dbfcf653271041a497e5f1bef1a169ca.*

(Continued)

*Primary Examiner* — Muna A Techane
(74) *Attorney, Agent, or Firm* — Brooks, Cameron & Huebsch, PLLC

(57) ABSTRACT

Fuses can store different delay states to cause execution of a command to be staggered for different memory dies of a memory package. Fuse arrays can be included in the memory package and programmed to cause execution of a command to be delayed by different amounts for different dies. The fuse arrays can be fabricated and then programmed to cause different delays for different dies.

19 Claims, 7 Drawing Sheets

(56) References Cited

OTHER PUBLICATIONS

3-Dimensional Stack (3DS) DDR4 SDRAM, Micron Data Sheet,2018,pp. 1-75, retrieved from https:/Avww.micron.m/-/media/client/global/documents/products/data-sheet/dram/ddr4/16gb_32gb_x4_x8_3ds_ddr4_sdram.pdf.*

Micron DDR 5:Key Module Features, MicronTechnical Brief,2020,pp. 1-7, retrieved from https://media-www.icron.com/-/media/client/global/documents/products/technical-marketing-brief/ddr5_key_module_features_tech_brief, df?la=en-in&rev=f3ca96bed7d9427ba72b4c192dfacb56.*

"High Bandwidth Memory with ECC", Micron Data Sheet, 2018, pp. 1-11, retrieved from https://media-www.micron.com/-/media/client/global/documents/products/data-sheet/dram/hbm2e/8gb_and_16gb_hbm2e_dram.pdf?rev=dbfcf653271041a497e5f1bef1a169ca.

"3-Dimensional Stack (3DS) DDR4 SDRAM", Micron Data Sheet, 2018, pp. 1-75, retrieved from https://www.micron.com/-/media/client/global/documents/products/data-sheet/dram/ddr4/16gb_32gb_x4_x8_3ds_ddr4_sdram.pdf.

"Micron DDR5: Key Module Features", Micron Technical Brief, 2020, pp. 1-7, retrieved from https://media-www.micron.com/-/media/client/global/documents/products/technical-marketing-brief/ddr5_key_module_features_tech_brief.pdf?la=en-in&rev=f3ca96bed7d9427ba72b4c192dfacb56.

\* cited by examiner

FUSE DELAY OF A COMMAND IN A MEMORY PACKAGE

TECHNICAL FIELD

The present disclosure relates generally to memory, and more particularly to apparatuses and methods associated with fuse delay of commands in a memory package.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1A:
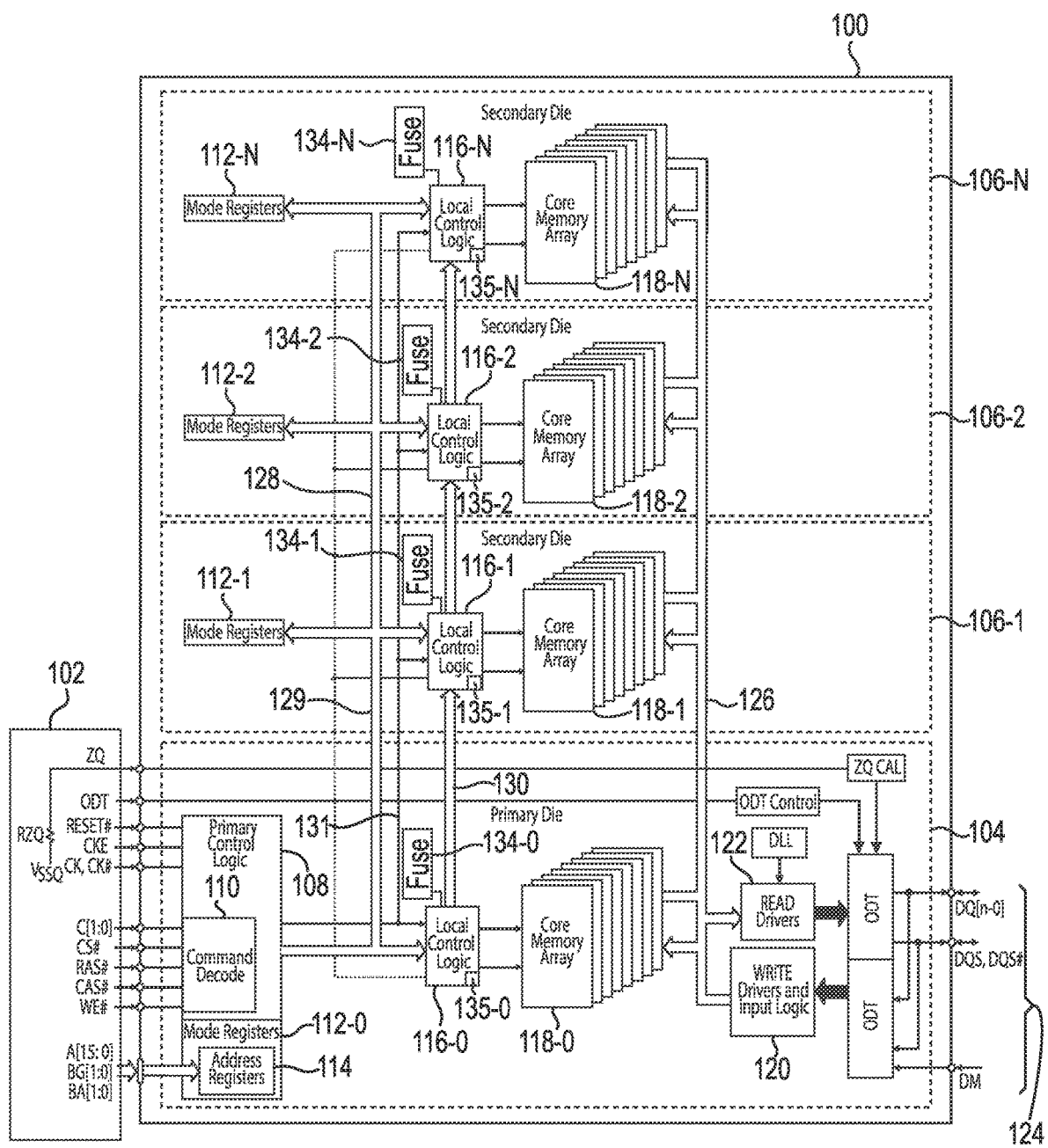
FIG. 1A is a block diagram of an apparatus in the form of a memory package including memory dies each with a fuse array in accordance with a number of embodiments of the present disclosure.

The present disclosure includes apparatuses and methods related to fuse delay of a command in a memory package. The command is intended to be executed by more than one die in a memory package, such as an all-die command. Typically, the all-die command would be executed simultaneously by more than one die in the memory package. However, embodiments are not limited to all-die commands as some memory packages execute commands other than all-die commands by multiple dies. Refresh pumps of the dies and activate operations of the dies are typically aligned since they receive the command at the same time. This can cause an instantaneous power spike for the memory package and large current draw, which can also cause a power supply droop.

Aspects of the present disclosure address the above and other deficiencies. For instance, a fuse delay can be introduced to the memory dies to cause execution of the command to be staggered for different dies. One or more fuse arrays can be included in the memory package, which can be read and the information stored therein can be used to cause execution of the command to be delayed by different amounts for different dies. The fuse arrays can be fabricated generically and then programmed to cause different delays to be created. The staggered execution of the command can help reduce the instantaneous power spike, current draw, and supply droop.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1A, and a similar element may be referenced as 200 in FIG. 2. Analogous elements within a Figure may be referenced with a hyphen and extra numeral or letter. See, for example, elements 134-0, 134-1, 134-2, 134-N in FIG. 1A. Such analogous elements may be generally referenced without the hyphen and extra numeral or letter. For example, elements 134-0, 134-1, 134-2, 134-N may be collectively referenced as 134. As used herein, the designators "N" and "Y", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1A is a block diagram of an apparatus in the form of a memory package 100 including memory dies 104, 106-1, 106-2, 106-N each with a fuse array 134-0, 134-1, 134-2, . . . , 134-N in accordance with a number of embodiments of the present disclosure. The memory die 104 can be referred to as a primary die or primary memory die and the memory dies 106 can be referred to as secondary memory dies because they receive commands, data, and/or other control signals from the primary die 104. The primary die 104 may also be referred to in the art as a master die. The secondary memory dies 106 may also be referred to in the art as a slave memory die. The primary die 104 receives commands, data, and/or other control signals from an interface 102 to a host, which may be a memory controller. The term "host," as used herein, includes memory controllers.

Figure 1B:
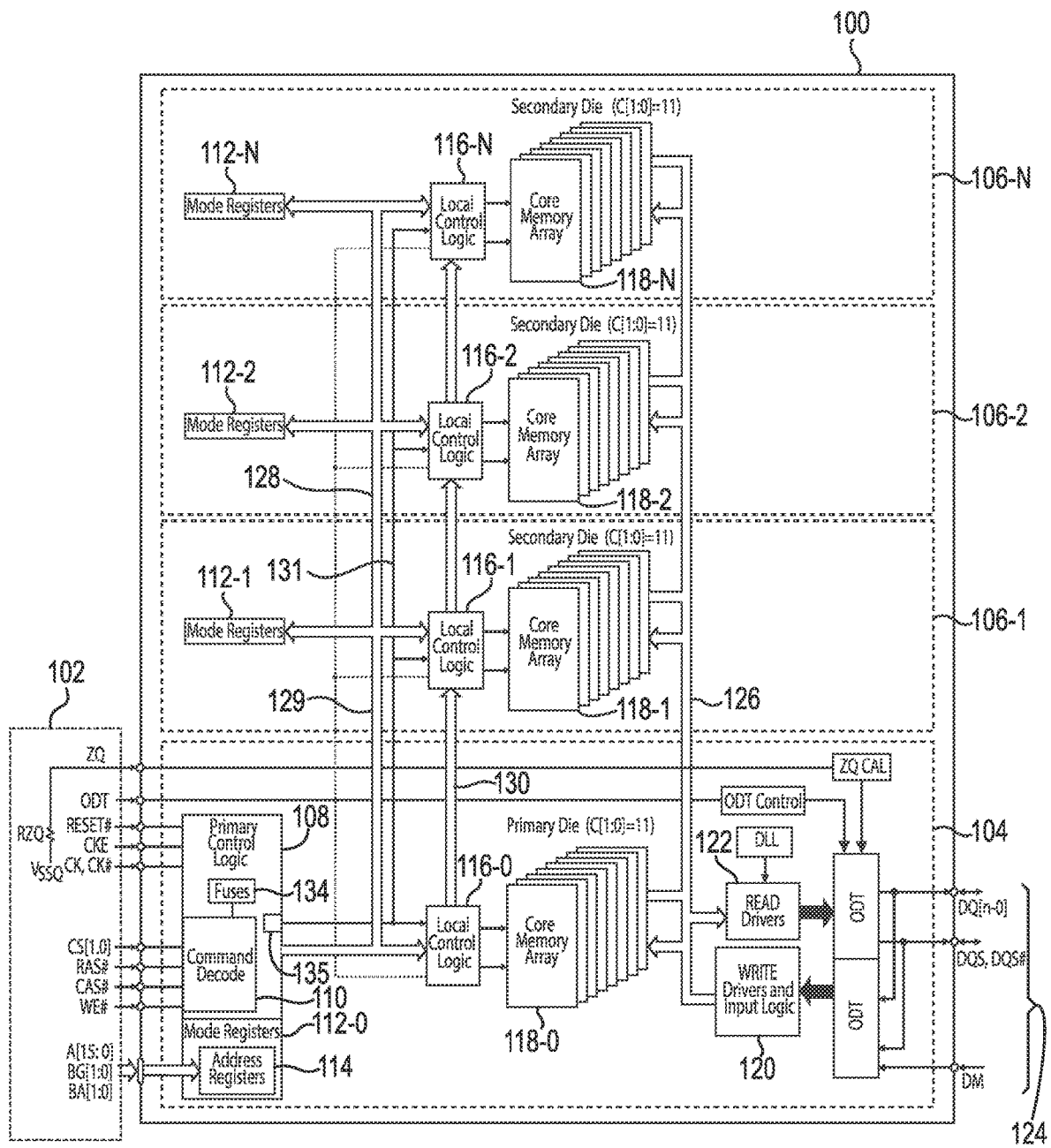
FIG. 1B is a block diagram of an apparatus in the form of a memory package with a fuse array in accordance with a number of embodiments of the present disclosure.

FIG. 1B is a block diagram of an apparatus in the form of a memory package 100 with a fuse array 134 in accordance with a number of embodiments of the present disclosure. In contrast to FIG. 1A, the memory package 100 in FIG. 1B includes a fuse array only in the primary die 104, whereas the secondary memory dies 106-1, 106-2, . . . , 106-N do not include fuse arrays. The commonalities between FIGS. 1A and 1B are described together and the differences are described in individual detail.

The memory package 100 is coupled to a host via an interface 102. As used herein, a host, a memory package 100, or a memory array 118, for example, might also be separately considered to be an "apparatus." The memory package 100 can provide main memory for a host or can be used as additional memory or storage for the host. An examples of the memory package 100 is a three-dimensional stack (3DS) memory package.

The interface 102 can pass control, address, data, and other signals between the memory package 100 and the host. The interface 102 can include a command bus (e.g., coupled to the command decode circuitry 110 on the primary control logic 108) and an address bus (e.g., coupled to the address registers 114). The primary control logic 108 can also be referred to as a command input and control circuit (or more generally, "control circuitry"). The primary control logic 108 can comprise a state machine, a sequencer, and/or some other type of control circuitry, which may be implemented in the form of hardware, firmware, or software, or any combination of the three.

Although illustrated separately, the interface 102 can include a data bus (e.g., coupled to the input/output (I/O) circuitry 124), however, as illustrated, in some embodiments, the I/O circuitry 124 is separate from the interface 102. For example, the interface 102 can be a controller interface and the I/O circuitry can be coupled to a host different than the controller. In some embodiments, the command bus and the address bus can be comprised of a common command/address bus. In some embodiments, the command bus, the address bus, and the data bus can be part of a common bus. The interface 102 can be a physical interface employing a suitable protocol. Such a protocol may be custom or proprietary, or the interface 102 may employ a standardized protocol, such as Peripheral Component Interconnect Express (PCIe), Gen-Z interconnect, cache coherent interconnect for accelerators (CCIX), etc. In some cases, the address registers 114 can be embedded in mode registers 112-0 on the primary die 104.

The command bus can pass signals between the host and the command decode circuitry 110 such as clock signals for timing, chip selects, write enable signals, die select signals (which may also be referred to as logical rank addresses for the embodiment illustrated in FIG. 1A: "C[1:0]", which allows individual addressing of the primary die 104 and each secondary memory die 106), etc. The command decode circuitry 110 can decode signals provided by the host. The signals can be commands provided by the host. These commands can be used to control operations performed on the memory arrays 118. Such operations can include data read operations, data write operations, data erase operations, data move operations, etc. The commands can be decoded by command decode circuitry 110 and forwarded to the memory arrays 118 via local control logic 116-0, 116-1, 116-2, . . . , 116-N. The local control logic 116-0 on the primary die 104 is coupled to the local control logic 116-1 on the secondary memory die 106-1. The local control logic 116-1 on the secondary memory die 106-1 is coupled to the local control logic 116-2 on the secondary memory die 106-2. The local control logic 116-2 on the secondary memory die 106-2 is coupled to the local control logic 116-N on the secondary memory die 106-N. The local control logic 116 of the memory package 100 are coupled in a chained configuration. A common internal command bus 131 is coupled to the primary control logic 108, to the local control logic 116-0 on the primary die 104, and the local control logic 116-1, 116-2, . . . , 116-N on each secondary memory die 106.

As illustrated in FIG. 1A, a respective fuse array 134 is coupled to each local control logic 116. Specifically, the local control logic 116-0 of the primary die 104 is coupled to a fuse array 134-0, the local control logic 116-1 of the secondary memory die 106-1 is coupled to a fuse array 134-1, the local control logic 116-2 of the secondary memory die 106-2 is coupled to a fuse array 134-2, and the local control logic 116-N of the secondary memory die 106-N is coupled to a fuse array 134-N.

As illustrated in FIGS. 1A-1B, the local control logic 116-0 of the primary die 104 is coupled to trim circuitry 135-0, the local control logic 116-1 of the secondary memory die 106-1 is coupled to trim circuitry 135-1, the local control logic 116-2 of the secondary memory die 106-2 is coupled to trim circuitry 135-2, and the local control logic 116-N of the secondary memory die 106-N is coupled to trim circuitry 135-N. The trim circuitry 135 is coupled to the fuse array 134 and to the memory array 118.

As used herein, the term "fuse" includes both fuses and antifuses. A fuse is conductive in an initial state and, when programmed (e.g., by being subjected to excessive current), makes a transition to an insulated state (e.g., the electrically conductive path breaks or is "blown"). An antifuse is insulated in an initial state and, when programmed (e.g., by being subjected to dielectric breakdown), makes a transition to a conductive state. After transition, a fuse or antifuse cannot return to its initial state, and is referred to as being one-time-programmable. In some embodiments, the fuse can be a gate oxide fuse, which can be one-time-programmable by breaking a gate oxide in a metal oxide semiconductor device. Other examples of fuses include one resistor—one transistor cells and one resistor—one diode cells, among others.

A fuse array 134 is a collection of addressable fuses located somewhere on a die. In some embodiments, there is only one fuse array 134 per die. The fuse array 134 can store manufacturing settings (e.g., repair addresses, voltage trims, timing trims, die identification, die config settings, speed settings, functions, etc.). On powerup or reset, the fuses are sensed with fuse logic circuitry (not specifically illustrated) one set at a time and broadcast on fuse bus routes (not specifically illustrated) around the die. The fuse states are then latched locally in trim circuitry, such as the trim circuitry 135. The fuse array 134 is physically separate from the trim circuitry 135. The trim circuitry 135 can include fuse latches. The fuse latches are latches/flip flops that store the fuse data near the circuitry it is used to adjust. According to at least one embodiment of the present disclosure, the fuse latches can enable/disable a delay in a command path based on the latched states from the fuse array 134.

The primary control logic 108 can be configured to distribute commands to the secondary memory dies 106. Example command types include die-specific commands and all-die commands. An all-die command is a command that is intended to be executed by every die 104, 106 in the memory package 100. In contrast, a command that is intended to be executed by only one die may have a die select signal associated therewith (e.g., "C[1:0]", as illustrated in FIG. 1A). In some instances, multiple die-specific commands can be issued simultaneously to different die. Commands can be received via the interface 102 from a host or can be generated by the primary control logic 108. Typically, all-die commands are executed simultaneously, however according to at least one embodiment of the present disclosure, each fuse array 134 can be programmed with a different respective delay state. The trim circuitry 135 (e.g., fuse latches) can latch the different respective delay state from the respective fuse array 134 to delay execution of the all-die command differently for each of the secondary memory dies 106 and the primary die 104. In at least one embodiment, the fuse array 134-0 of the primary die 104 is not programmed to cause a delay in execution of commands for the primary die 104, which can cause an all-die command to be executed on the primary die 104 without a fuse-trimmed delay before being executed on the secondary memory dies 106 due to the delay caused by the fuse arrays 134-1, 134-2, ..., 134-N and corresponding fuse latches.

In the embodiment illustrated in FIG. 1B, a fuse array 134 is coupled to the primary control logic 108 of the primary die 104 rather than being coupled to the local control logic 116 of the primary die 104 and each secondary die 106. The primary control logic 108 can be configured to distribute an all-die command (or all commands) to the secondary memory dies 106 irrespective of their individual die select addresses. The fuse array 134 is programmed to delay the all-die command differently for each of the secondary memory dies 106. The fuse array 134 can be programmed with a different respective delay state for each of the respective secondary memory dies 106. The trim circuitry 135 can latch the different respective delay states from the fuse array 134 and delay distribution of an all-die command to the secondary memory dies according to the different respective delay states. The primary control logic 108 can distribute the all-die command to the secondary memory dies 106 via the trim circuitry 135. In at least one embodiment, the fuse array 134 is programmed to delay the all-die command differently for the primary die 104 and for each of the secondary memory dies 106.

Although not specifically illustrated in FIG. 1A, at least one embodiment includes an additional secondary memory die coupled to the stack of secondary memory dies 106 in an analogous fashion to the secondary memory die 106-N, except that the additional secondary memory die is not configured to delay execution of a command, thereby causing an all-die (or any other) command sent to the additional memory die to be executed without delay. For example, a fuse array 134 of the additional secondary memory die may not be programmed with a delay state.

The address bus can pass signals between the host and the address registers 114 such as memory row addresses, memory bank group addresses, and memory bank addresses within a bank group, and/or other logical addresses for the memory arrays 118-0, 118-1, 118-2, 118-N. The address registers 114 can latch address signals provided over the interface 102. The address signals can be decoded by the primary control logic 108 and provided therefrom to the local control logic 116 to access the memory arrays 118 via a common internal address bus 129. The common internal address bus 129 can also be used to operate the mode registers 112-0, 112-1, 112-2, ..., 112-N on the primary die 104 and the secondary memory dies 106. For example, mode register set commands can be passed via the common internal address bus 129.

Data can be read from memory arrays 118 by sensing voltage and/or current changes on the sense lines using sensing circuitry controlled by read drivers 122 on the primary die 104. The sensing circuitry 122 can comprise, for example, sense amplifiers that can read and latch a page (e.g., row) of data from the memory array 118. Sensing (e.g., reading) a bit stored in a memory cell can involve sensing a relatively small voltage difference on a pair of sense lines, which may be referred to as digit lines or data lines. The read drivers 122 can be coupled to the memory arrays 118 along data lines 126.

Data can be provided to and/or from the memory arrays 118 via the data lines 126 coupling the memory arrays 118 to input/output (I/O) circuitry 124 via the read drivers 122 and/or write drivers and input logic 120. The I/O circuitry 124 can be used for bi-directional data communication with the host over an interface, such as the interface 102 or a separate interface. The write drivers and input logic 120 are used to write data to the memory arrays 118. The read drivers 122 are used to read data from the memory arrays 118. In some embodiments, the data path 126 can bypass the primary control logic 108.

The memory arrays 118 can include memory cells arranged in rows coupled by access lines (which may be referred to herein as word lines or select lines) and columns coupled by sense lines (which may be referred to herein as digit lines or data lines). Each of the memory arrays 118 illustrated can represent more than one memory array. Each of the memory arrays 118 can be arraigned in banks. The memory cells of the memory arrays 118 can be volatile memory cells and/or non-volatile memory cells. By way of example, the memory arrays 118 can be operated as double data rate (DDR) DRAM, such as DDR5, a graphics DDR DRAM, such as GDDR6, or another type of memory. Other examples of memory arrays 118 include RAM, ROM, SDRAM, LPDRAM, PCRAM, RRAM, flash memory, and 3DXPoint (e.g., an array of non-volatile memory that can perform bit storage based on a change of bulk resistance, in conjunction with a stackable cross-gridded data access array).

Figure 2:
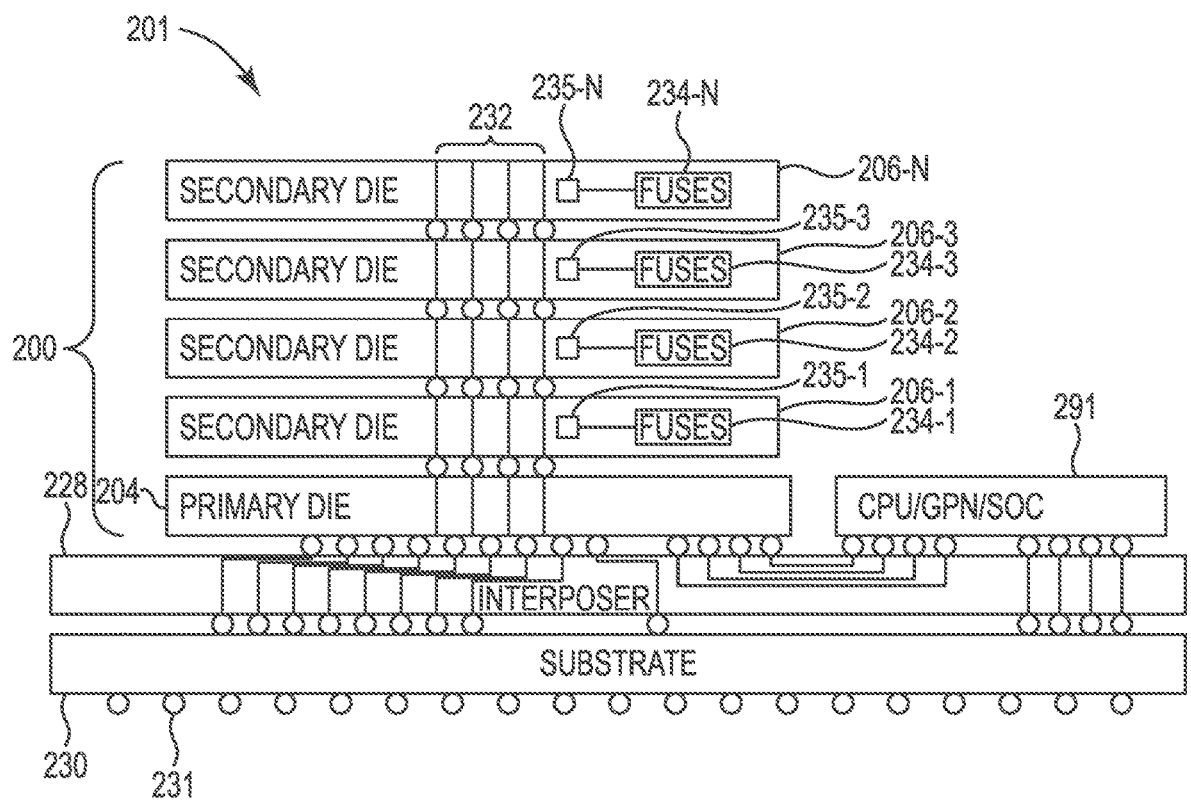
FIG. 2 is a block diagram of an apparatus in the form of a computing system including a memory package including memory dies with fuse arrays in accordance with a number of embodiments of the present disclosure.

FIG. 2 is a block diagram of an apparatus in the form of a computing system 201 including a memory package 200 including dies 204, 206-1, 206-2, 206-3, 206-N with fuse arrays 234-1, 234-2, 234-3, 234-N in accordance with a number of embodiments of the present disclosure. The secondary dies 206 receive commands, data, and/or other control signals from the primary die 204. The primary die 204 may also be referred to in the art as a base die, buffer die, or logic die. The secondary dies 106 may also be referred to in the art as memory dies. In some embodiments, the primary die 204 does not provide memory for the memory package 200, whereas the secondary dies 206 do. Although not specifically illustrated, the secondary dies 206 can include memory banks, such as DRAM memory banks. In at least one embodiment, the secondary dies 206 do not include local control logic (e.g., the local control logic 116 illustrated in FIGS. 1A-1B). Instead, the secondary dies 206 include terminals (e.g., command terminals, address terminals, data terminals, etc.) for being controlled by the primary die 204. The secondary dies 206 are coupled to the primary die 204 by through silicon vias (TSVs) 232. The secondary dies 206 are bonded to each other and to the primary die, the primary die is bonded to the interposer, which is also bonded to the controller 291 and to the substrate 230 by conductive connections 231, which may be referred to in the art as bumps or balls. The conductive connections 231 can pass signals, form terminals, provide ground connections, or merely serve as physical attachment points. Examples of the computing system 201 include high bandwidth memory (HBM), a hybrid memory cube (HMC), etc.

The primary die 204 receives commands, data, and/or other control signals via an interposer 228 from a CPU, graphics processing unit (GPU), or system on a chip controller 291, any of which may be referred to as a host or memory controller. The primary die 204 can decode commands and send them to the secondary dies 206 on a shared path via the TSVs 232. All or multiple of the secondary dies 206 can execute the commands. According to at least one embodiment of the present disclosure, each secondary die 206 includes a respective fuse array 234 and trim circuitry 235-1, 235-2, 235-3, 235-N (e.g., fuse latches) configured to stagger execution of a command by the secondary dies 206 by delaying the command differently for each secondary die 206 in a manner analogous to that described above with respect to FIG. 1A.

The fuse arrays 234 can be programmed prior to deployment of the memory package 200. The fuse arrays 234 can be programmed by a provider of the corresponding memory system 201. The fuse arrays 234 can be programmed with the use of a host and/or a testing circuitry. The fuse arrays 234 can be programmed by selectively changing or not changing a state of one or more individual fuses therein. In other words, each fuse is either left in its initial state or transitioned to a different state by the programming operation.

In some embodiments, each memory die 206 in a memory package 200 can include a fuse array 234. The fuse arrays 234 can be fabricated on each die 206 in the same fashion. However, each fuse array 234 can be programmed differently, for example, by changing the state of different individual fuses differently to store different delay states for each different fuse array 234 on the different dies. Programming each of the fuse arrays 234 differently can cause commands that are delivered to each die 206 in the memory package 200 to be executed at a different time. Executing the commands at a different time helps to evenly distribute the power consumption of the memory dies 206 so that any corresponding power spike for the memory package 200 is reduced.

Figure 3:
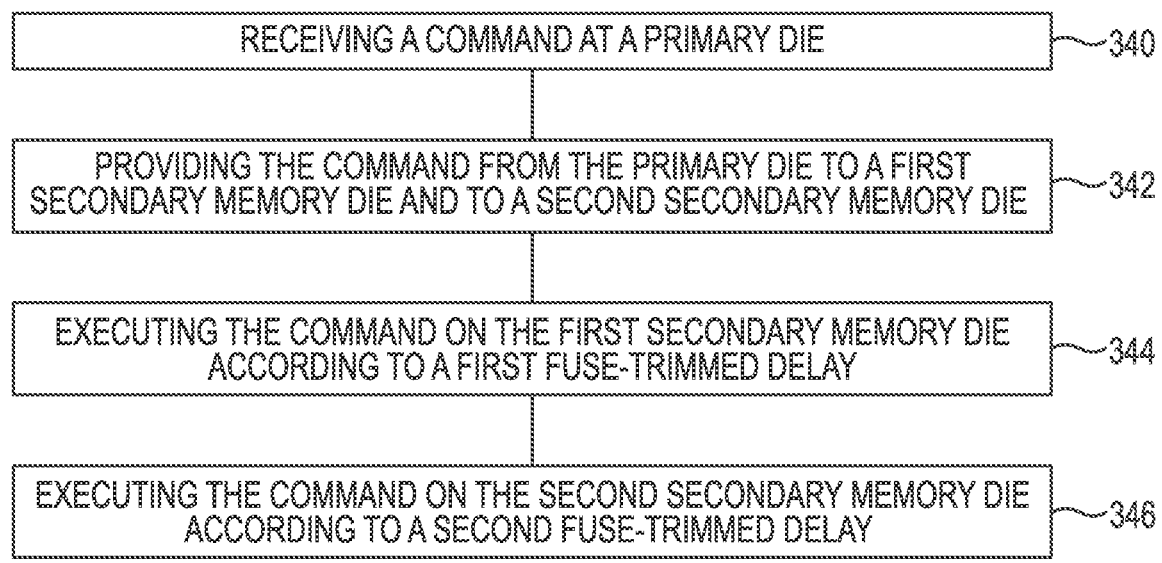
FIG. 3 is a flow diagram of a method for operating a memory package in accordance with a number of embodiments of the present disclosure.

FIG. 3 is a flow diagram of a method for operating a memory package in accordance with a number of embodiments of the present disclosure. The method can be performed by hardware (e.g., a processing device, circuitry, dedicated logic, programmable logic, microcode, hardware of a device, integrated circuit, etc.). For example, the method can be performed by circuitry associated with a memory package, such as the memory package 100 illustrated in FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel.

At block 340, the method can include receiving a command at a primary die. For example, the command can be received from a host coupled to the primary die and not at the first or second secondary dies. The primary die can be part of a memory package that also includes one or more secondary memory dies. In such embodiments, the command can be received from the host only by the primary die such that the secondary memory dies do not receive the command from the host.

At block 342, the method can include providing the command from the primary die to a first secondary memory die and to a second secondary memory die. The command can be provided from the primary die to additional secondary memory dies coupled to the primary die. The command can be provided from the primary die to the secondary memory die via a common command path internal to the memory package or via separate internal command paths for each secondary memory die.

At block 344, the method can include executing the command on the first secondary memory die according to a first fuse-trimmed delay. At block 346, the method can include executing the command on the second secondary memory die according to a second fuse-trimmed delay. Although not specifically illustrated, the method can include executing the command on the primary die according to a third fuse-trimmed delay. Execution of the command can be delayed differently for each secondary memory die coupled to the primary die.

In at least one embodiment, the method can include reading a first delay state and a second delay state from a fuse array associated with the primary die (e.g., as illustrated in FIG. 1B). The method can include latching the first delay state and the second delay state in trim circuitry and providing the first fuse-trimmed delay and the second fuse-trimmed delay via the trim circuitry.

In at least one embodiment, the method can include reading a first delay state from a first fuse array associated with the first secondary die and reading a second delay state from a second fuse array associated with the second secondary die (e.g., as illustrated in FIG. 1A or FIG. 2). The method can include latching the first delay state in first trim circuitry associated with the first secondary die and latching the second delay state in second trim circuitry associated with the second secondary die. The method can include providing the first fuse-trimmed delay via the first trim circuitry and providing the second fuse-trimmed delay via the second trim circuitry.

In some embodiments, the primary die may be able to independently address certain commands to the secondary memory dies such that a delay is not necessary in order to avoid a power spike associated with multiple dies executing a command simultaneously. However, such memory packages may also send and execute all-die commands, where the all-die command is generally executed simultaneously by the secondary dies (and the primary die in some instances). At least one embodiment of the present disclosure can help prevent initiation and/or execution of an all-die command by more than one secondary die at the same time by operation of the different fuse-trimmed delays.

Figure 4:
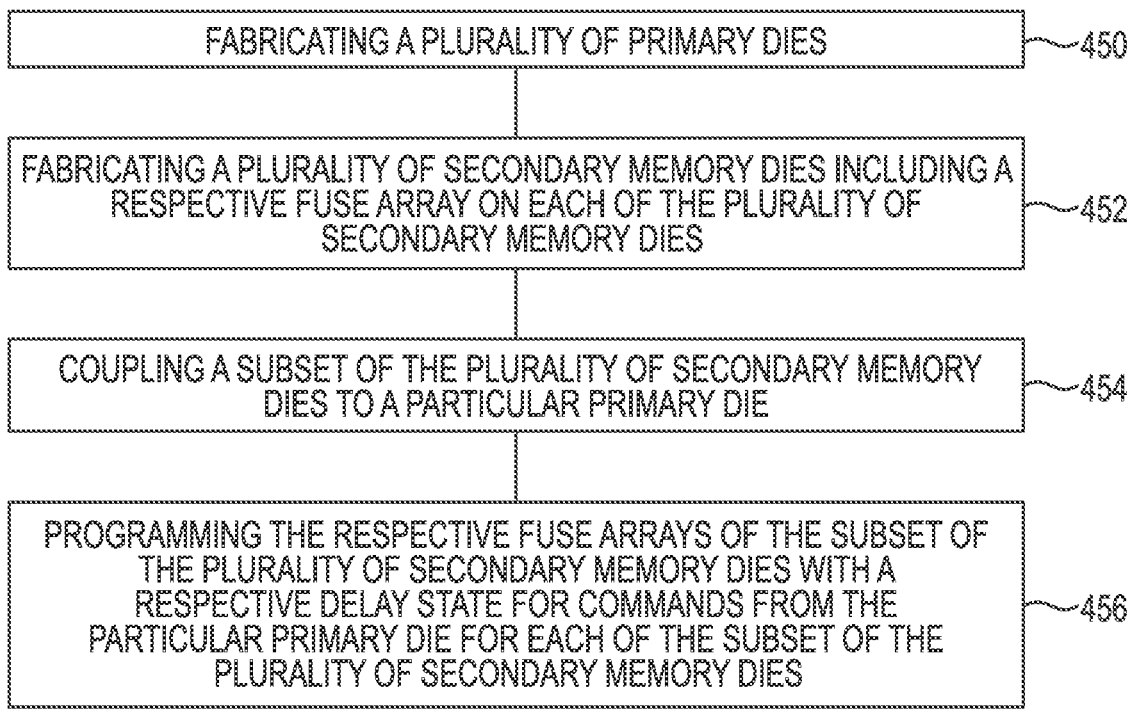
FIG. 4 is a flow diagram of a method for fabricating one or more memory packages in accordance with a number of embodiments of the present disclosure.

FIG. 4 is a flow diagram of a method for fabricating one or more memory packages in accordance with a number of embodiments of the present disclosure. The method can be performed by processing logic that can include hardware (e.g., a processing device, circuitry, dedicated logic, programmable logic, microcode, hardware of a device, integrated circuit, etc.), software (e.g., instructions run or executed on a processing device), or a combination thereof. One or more processes can be omitted in various embodiments. Thus, not all processes are required in every embodiment. Other process flows are possible.

At block 450, the method can include fabricating primary dies. At block 452, the method can include fabricating secondary memory dies each including a respective fuse array. The primary dies and/or secondary memory dies can be mass produced and then coupled into any number of memory packages as desired. The primary dies can be fabricated with or without memory arrays and/or fuse arrays as desired. The secondary memory dies include memory arrays. The fuse arrays on the secondary memory dies can be fabricated generically (e.g., without specific programming) and later programmed with device-specific settings. The secondary memory dies and/or the primary memory dies can be fabricated with latches configured to store settings that are programmed into the fuse arrays.

At block 454, the method can include coupling a subset of the secondary memory dies to a particular primary die to form a memory package. Non-limiting examples of the memory package include 3DS, HBM, and HMC.

At block 456, the method can include programming the fuse arrays of the secondary memory dies with a respective delay state for commands from the particular primary die for each of the subset of secondary memory dies. If a primary die is fabricated with a fuse array and memory array, the fuse array on the primary die can be programmed with a different delay state than the respective delay states for each of the subset of secondary memory dies. Programming a fuse array can include changing a conductive state of at least one element (e.g., fuse or anti-fuse) of the array. The fuse array can be programmed (e.g., by a manufacturer of the memory package, or by an intermediate party between the manufacturer and the end-user) prior to shipping the memory package. This allows the fuse arrays to be fabricated generically (at least with respect to programmed delay states) to facilitate efficient production. Subsequently, the delay states can be programmed into the fuse array as desired for any specific memory package or series of memory packages (such as a line of products). The fuse arrays can also store other operational settings for the dies.

Figure 5:
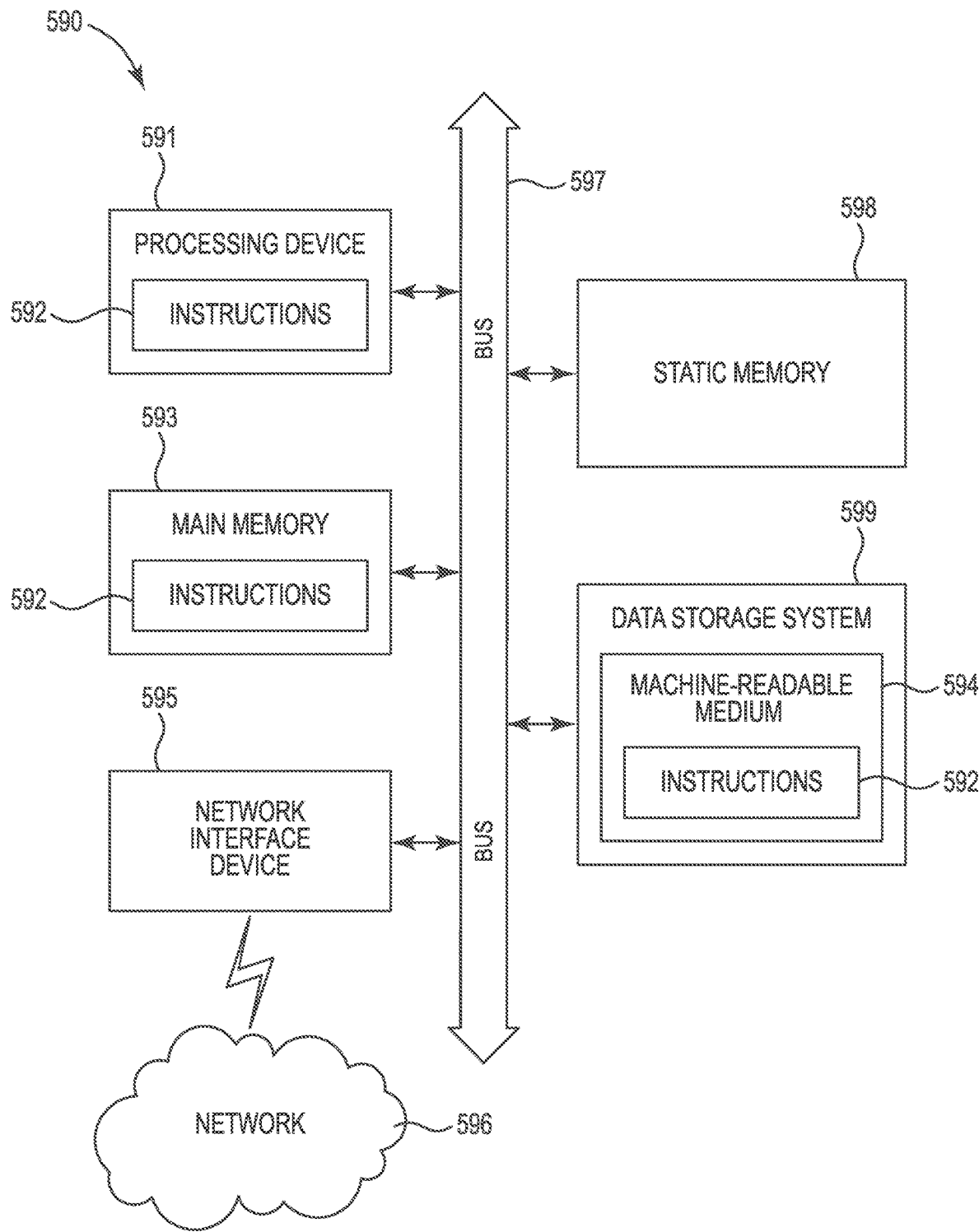
FIG. 5 illustrates an example computer system within which a set of instructions, for causing the machine to perform various methodologies discussed herein, can be executed.

FIG. 5 illustrates an example computer system within which a set of instructions, for causing the machine to perform various methodologies discussed herein, can be executed. In various embodiments, the computer system 590 can correspond to a system (e.g., the computing system described with respect to FIGS. 1A-1B) that includes, is coupled to, or utilizes a memory sub-system (e.g., the memory package 100 of FIG. 1) or can be used to perform the operations of control circuitry. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 590 includes a processing device 591, a main memory 593 (e.g., read-only memory (ROM), flash memory, dynamic random access memory (DRAM) such as synchronous DRAM (SDRAM) or Rambus DRAM (RDRAM), etc.), a static memory 598 (e.g., flash memory, static random access memory (SRAM), etc.), and a data storage system 599, which communicate with each other via a bus 597.

The processing device 591 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 591 can also be one or more special-purpose processing devices such as an application specific integrated circuit (ASIC), a field programmable gate array (FPGA), a digital signal processor (DSP), network processor, or the like. The processing device 591 is configured to execute instructions 592 for performing the operations and steps discussed herein. The computer system 590 can further include a network interface device 595 to communicate over the network 596.

The data storage system 599 can include a machine-readable storage medium 594 (also known as a computer-readable medium) on which is stored one or more sets of instructions 592 or software embodying any one or more of the methodologies or functions described herein. The instructions 592 can also reside, completely or at least partially, within the main memory 593 and/or within the processing device 591 during execution thereof by the computer system 590, the main memory 593 and the processing device 591 also constituting machine-readable storage media.

The instructions 592 can be executed to carry out any of the embodiments described herein. For example, the instructions 592 can be executed to implement functionality corresponding to the host, the memory package 100, and/or the primary control logic 108 of FIGS. 1A-1B.

While the machine-readable storage medium 594 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Figure 6:
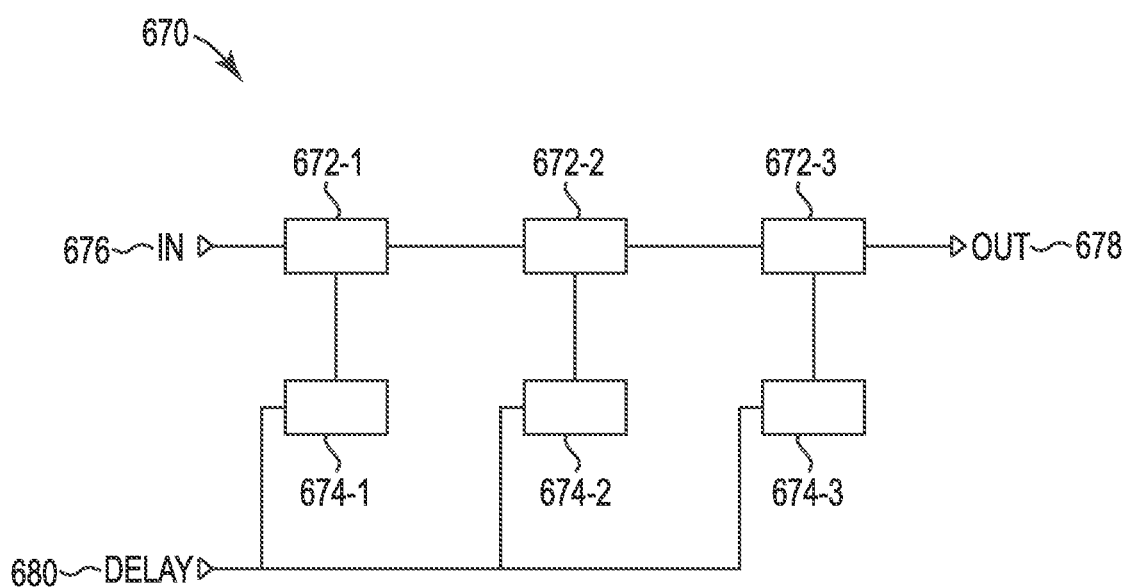
FIG. 6 illustrates an example of a delay path in accordance with a number of embodiments of the present disclosure.

FIG. 6 illustrates an example of a delay path 670 in accordance with a number of embodiments of the present disclosure. The delay path 670 includes an input 676 and an output 678. The input and output can be on any portion of a command path. Between the input and output are three delay blocks 672-1, 672-2, 672-3. The delay path 670 also includes a delay trim input 680. The delay trim input 680 represents the latched fuse states, which are used to select an amount of delay in the command path. The delay trim input 680 can select or activate any combination of the delay blocks 672 via the selector blocks 674-1, 672-2, 674-3. The delay trim input 680 is illustrated as being connected to three different delay selector blocks 674-1, 674-2, 671-3, any combination of which can be selected with the delay trim input 680 to vary the total delay applied between the input 676 and the output 678. As illustrated, eight different individual delays are selectable with the three different delay states 674. Embodiments are not limited to three delay states as other quantities of delay states are possible.

By way of example, the delay blocks 672 can represent inverters added in series to delay a signal, however embodiments are not limited to this example. The delay trim input 680 can activate the selector blocks 674, which can be multiplexed with the delay blocks 672 to effectively create an addressable or selectable variable delay path between the input 676 and the output 678.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a plurality of secondary memory dies each including:
      a respective memory array;
      a respective fuse array; and
      respective trim circuitry coupled to the respective fuse array and to the respective memory array; and
   a primary die coupled to the plurality of secondary memory dies, the primary die including control logic configured to distribute a command to the plurality of secondary memory dies;
   wherein each respective fuse array is programmed with a different respective delay state;
   wherein each respective trim circuitry is configured to:
      latch the different respective delay state from the respective fuse array; and
      delay execution of the command on the corresponding secondary memory die according to the different respective delay state.

2. The apparatus of claim 1, wherein the primary die further includes a memory array, a fuse array, and trim circuitry coupled to the fuse array; and
   wherein the fuse array of the primary die is programmed with a delay state different than that of the respective fuse arrays of the secondary dies; and
   wherein the trim circuitry of the primary die is configured to:
      store the delay state of the fuse array of the primary die; and
      delay the command for the primary die differently than each of the plurality of secondary memory dies.

3. The apparatus of claim 1, wherein the control logic of the primary die is configured to distribute all-die commands to the plurality of secondary memory dies and to address die-specific commands to individual secondary memory dies; and
   wherein the command comprises an all-die command.

4. The apparatus of claim 1, wherein the control logic of the primary die is configured to distribute all commands to the plurality of secondary memory dies.

5. The apparatus of claim 1, further comprising an additional secondary memory die coupled to the primary die;
   wherein the additional secondary memory die includes a memory array, a fuse array, and trim circuitry coupled to the memory array and to the fuse array;
   wherein the fuse array of the additional secondary memory die is not programmed with a delay state; and
   wherein the additional secondary memory die is configured to execute the command without delay.

6. An apparatus, comprising:
   a plurality of secondary memory dies each including:
      respective local control logic; and
      a respective memory array coupled to the respective local control logic; and
   a primary die coupled to the plurality of secondary memory dies, the primary die including:
      a fuse array programmed with a different respective delay state for each of the respective secondary memory dies; and
      trim circuitry configured to:
         latch the different respective delay states from the fuse array; and
         delay distribution of an all-die command to the secondary memory dies according to the different respective delay states.

7. The apparatus of claim 6, wherein the primary die further comprises primary control logic coupled to the fuse array, the trim circuitry, and the plurality of secondary memory dies; and
   wherein the primary control logic is configured to distribute the all-die command to the plurality of secondary memory dies via the trim circuitry.

8. The apparatus of claim 7, wherein the primary die includes a host interface; and
   wherein the primary control logic is coupled to the host interface and configured to receive the command from the host interface.

9. The apparatus of claim 7, wherein the primary control logic is configured to generate the command.

10. The apparatus of claim 6, wherein the primary die includes a plurality of memory arrays coupled to the local control logic; and
    wherein the plurality of secondary memory dies each include a respective plurality of memory arrays coupled to the respective local control logic.

11. A method, comprising:
    distributing a command to a plurality of secondary memory dies by a primary die coupled to the plurality of secondary memory dies, wherein the plurality of secondary memory dies each include:
       a respective memory array;
       a respective fuse array, wherein each respective fuse array is programmed with a different respective delay state; and
       respective trim circuitry coupled to the respective fuse array and to the respective memory array;

latching, via each respective trim circuitry, the different respective delay state from the respective fuse array; and delaying, via each respective trim circuitry, execution of the command on the corresponding secondary memory die according to the different respective delay state.

12. The method of claim 11, wherein the primary die further includes a memory array, a fuse array, and trim circuitry coupled to the fuse array;

wherein the fuse array of the primary die is programmed with a delay state different than that of the respective fuse arrays of the secondary dies; and wherein the method further comprises:
storing, via the trim circuitry of the primary die, the delay state of the fuse array of the primary die; and
delaying, via the trim circuitry of the primary die, the command for the primary die differently than each of the plurality of secondary memory dies.

13. The method of claim 11, further comprising:
distributing, by the primary die, all-die commands to the plurality of secondary memory dies; and
addressing, by the primary die, die-specific commands to individual secondary memory dies;
wherein the command comprises an all-die command.

14. The method of claim 11, further comprising distributing all commands to the plurality of secondary memory dies via the primary die.

15. The method of claim 11, wherein an additional secondary memory die is coupled to the primary die;

wherein the additional secondary memory die includes a memory array, a fuse array, and trim circuitry coupled to the memory array and to the fuse array;

wherein the fuse array of the additional secondary memory die is not programmed with a delay state; and wherein the method further comprises executing the command without delay by the additional secondary memory die.

16. A method, comprising:
latching, via trim circuitry of a primary die, different respective delay states from a fuse array of the primary die programmed with a different respective delay state for each of a plurality of secondary memory dies coupled to the primary die; and delaying, via the trim circuitry, distribution of an all-die command to the secondary memory dies according to the different respective delay states;

wherein the plurality of secondary memory dies each include:
respective local control logic; and
a respective memory array coupled to the respective local control logic.

17. The method of claim 16, wherein the primary die further comprises primary control logic coupled to the fuse array, the trim circuitry, and the plurality of secondary memory dies; and wherein the method further comprises distributing, by the primary control logic, the all-die command to the plurality of secondary memory dies via the trim circuitry.

18. The method of claim 17, wherein the primary die includes a host interface coupled to the primary control logic; and wherein the method further comprises receiving the command from the host interface by the primary control logic.

19. The method of claim 17, further comprising generating the command by the primary control.

* * * * *